(12) United States Patent
Key et al.

(10) Patent No.: US 7,230,339 B2
(45) Date of Patent: Jun. 12, 2007

(54) COPPER RING SOLDER MASK DEFINED BALL GRID ARRAY PAD

(75) Inventors: Chung C. Key, Penang (MY); Leong Kum Foo, Kedah (MY); PangToh Tien, Johor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/402,101

(22) Filed: Mar. 28, 2003

(65) Prior Publication Data

US 2004/0188836 A1   Sep. 30, 2004

(51) Int. Cl.
*H01L 23/48* (2006.01)
*H01L 23/52* (2006.01)
*H01L 29/40* (2006.01)

(52) U.S. Cl. .................. 257/773; 257/784; 257/786
(58) Field of Classification Search ................ 257/780, 257/781, 784, 786, 779, 773; 438/612, 613, 438/632, 671
See application file for complete search history.

(56) References Cited

U.S. PATENT DOCUMENTS

| | | | | |
|---|---|---|---|---|
| 3,508,124 A | * | 4/1970 | Lowry et al. | 257/762 |
| 4,622,576 A | * | 11/1986 | Buynoski | |
| 5,148,265 A | * | 9/1992 | Khandros et al. | 257/773 |
| 5,415,555 A | * | 5/1995 | Sobhani | |
| 5,977,632 A | * | 11/1999 | Beddingfield | |
| 6,084,296 A | * | 7/2000 | Colello et al. | 257/698 |
| 6,104,087 A | * | 8/2000 | DiStefano et al. | |
| 6,465,878 B2 | * | 10/2002 | Fjestad et al. | |

* cited by examiner

*Primary Examiner*—S. V. Clark
(74) *Attorney, Agent, or Firm*—Schwegman, Lundberg, Woessner & Kluth, P.A.

(57) ABSTRACT

A ball grid array device includes a substrate, further including a first major surface and a second major surface. An array of pads is positioned on one of the first major surface or the second major surface. At least some of the pads include a raised ring. The raised ring circumscribes the pad or surrounds an interior pad or land on the substrate.

8 Claims, 5 Drawing Sheets

COPPER RING SOLDER MASK DEFINED BALL GRID ARRAY PAD

FIELD OF THE INVENTION

The present invention is related to ball grid array packages. More specifically, the present invention relates to methods and apparatus for forming a more co-planar and reliable structure for ball grid array packages.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die and on the exterior of the semiconductor packages that receive the die, for connecting the packaged device to external systems, such as a printed circuit board.

In the past, the die and package were first attached and then were wire bonded. Wire bonding has many problems. The problems include limiting the number of pads and placement of the pads on the die, and a chance of electrical performance problems or shorting if the wires come too close to each other. As a result, wire bonding has given way to ball grid array packages in many applications.

Ball grid arrays ("BGAs") are an array of solder bumps or balls that cover the surface of the die or semiconductor package and are used to connect the die and the semiconductor package. A typical BGA package is characterized by a large number of solder balls disposed in an array on a surface of the package. It is not uncommon to have hundreds of solder balls in an array. The BGA package is assembled to a matching array of conductive pads. The pads are connected to other devices within a substrate or circuitry on a circuit board. Heat is applied to reflow the solder balls (bumps) on the package, thereby wetting the pads on the substrates and, once cooled, forming electrical connections between the package and the semiconductor device contained in the package and the substrate.

BGAs have the advantage of providing more connections between the die and the semiconductor package. The BGAs also have the advantage that the size of the balls or bumps can be made smaller to provide a higher density of solder bumps or balls or a greater number of connections from a die. BGAs are formed by placing an amount of solder on a solder pad and heating the solder to a melting point. The surface tension associated with the liquid solder causes the solder to form a solder ball. The solder ball retains its shape as it cools to form a solid solder ball or bump.

Figure 1:
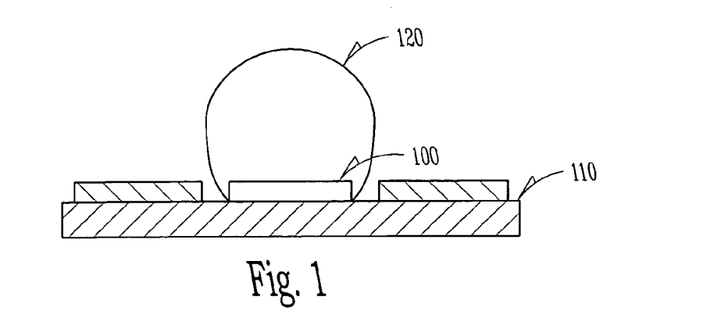
FIG. 1 illustrates a schematic view of a metal defined flat pad associated with a BGA device.
Figure 2:
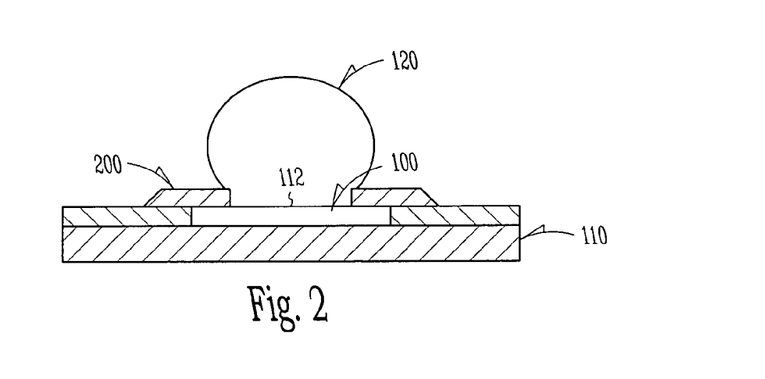
FIG. 2 illustrates a schematic view of a solder mask defined flat pad associated with a BGA device.

Two basic types of BGA pads for interconnection include a metal defined flat pad (MD) type BGA, and a solder mask defined flat pad (SMD) type BGA. Both of these two types of BGA pads are shown in FIGS. 1 and 2 of the attached drawings. The solder adheres to the metal of the pad and not to the non-metallic substrate. In the metal defined flat pad type BGA, shown in FIG. 1, a metal pad 100 is initially formed on a substrate 110. Molten solder is then applied to the metal pad 100. The surface tension associated with the liquid or molten solder 120 forms the solder into a solder ball 120. The solder 120 adheres to the entire metal pad 100. In the solder mask flat pad type of BGA, shown in FIG. 2, a metal pad 100 is initially formed on a substrate 110. Then a solder mask 200 is laid down to further limit the opening portion of the metal pad 100 that the solder adheres to. In other words, the solder of the solder ball 120 formed adheres only to the uncovered or unmasked portion 112 of the metal pad. The solder adheres to the metal and not the solder mask. The surface tension associated with the liquid or molten solder 120 forms the solder into a solder ball 120. The solder 120 adheres to the uncovered portion 112 of the metal pad 100.

Figure 3:
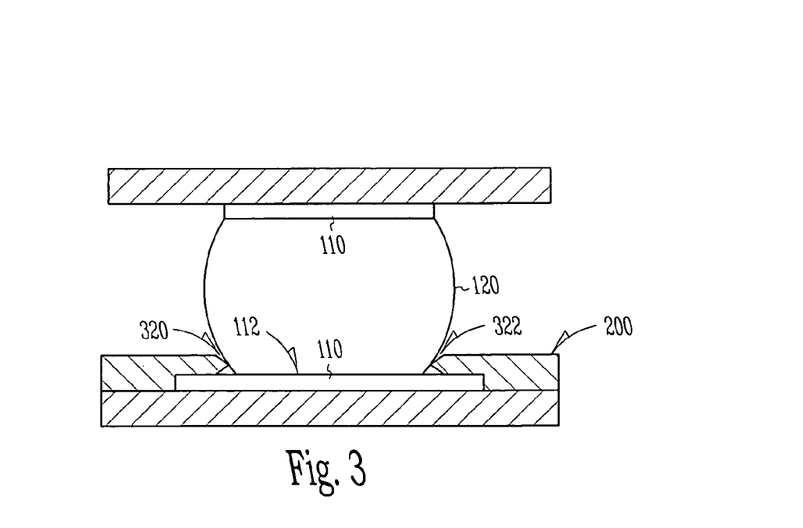
FIG. 3 illustrates a cross-sectional view of a component attached to a printed circuit board using a solder mask defined BGA.

In the metal defined flat pad type of BGA, there may be a weakness referred to as pad cratering. Pad cratering occurs when the solder ball undergoes mechanical bending stress. Adding a solder mask lessens pad cratering. FIG. 3 is a cross-sectional view of a component attached to a printed circuit board using solder mask defined BGA. As shown by arrows referenced as 320 and 322, as the solder mask is formed by etching, a point is formed in the solder mask 200. In the solder mask defined flat pad type BGA, there may be a weakness due to stress concentration that becomes problematic as the solder ball undergoes thermal cycling. The points 320, 322 are formed along or near the top surface of the solder mask 200 and at the periphery of the BGA. The points 320, 322 are formed because the etchant used to remove solder mask material undercuts the remaining mask material. The points may then act to concentrate stress. After a certain amount of thermal cycling, the solder ball may fatigue or crack at the point of stress. In addition, the solder mask defined flat type pad also has relatively high variation in pad diameter and size because of difficulties and limitations associated with the solder masking process. When the solder balls are of different diameters unintended opens may occur since the tops of the solder balls are not substantially coplanar. The solder balls may be misaligned after placement on a printed circuit board or substrate prior to solder reflow.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

In the following detailed description of the preferred embodiments, reference is made to the accompanying drawings that form a part hereof, and in which are shown by way of illustrating specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 4A:
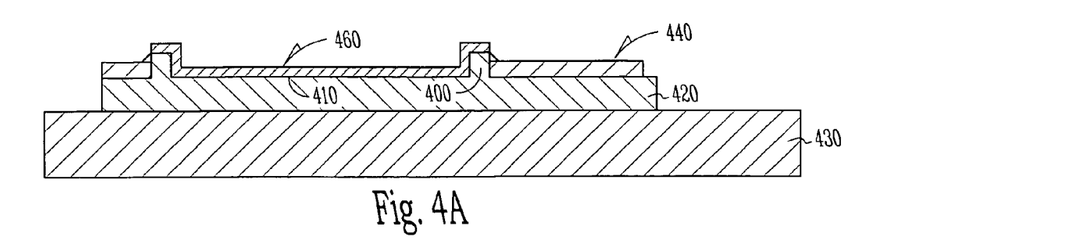
FIG. 4A illustrates a cross-sectional schematic view of a ring for a BGA land, according to an embodiment of this invention.
Figure 4B:
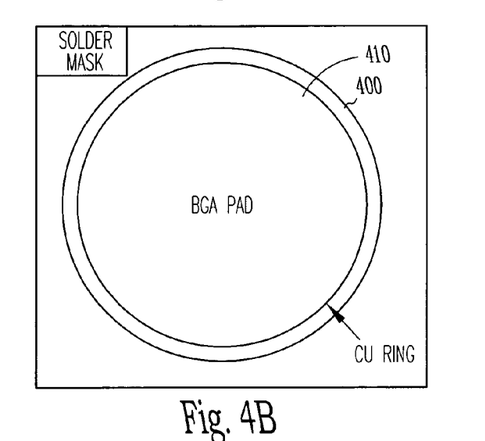
FIG. 4B illustrates a top schematic view of a ring for a BGA land, according to an embodiment of this invention.

FIG. 4A illustrates a cross-sectional schematic view of a ring 400 for a BGA land 410. FIG. 4B illustrates the top view of a ring 400 for a BGA land 410, according to an embodiment of this invention. It should be noted that FIGS. 4A and 4B show a single ring around a single BGA land 410, and that it should be understood that a ball grid array device will have multiple rings arrayed on a substrate about multiple lands 410. FIGS. 4A and 4B show a single ring 400 around a single land 410. A layer of copper, or other conductive material, 420 is deposited on top of a substrate 430. The substrate 430 can be associated with a die, an electrical component, or a printed circuit board, or other device. A ring 400 of conductive material surrounds a land 410. The ring 400 has a wall thickness of approximately 2 mils and a height of approximately 2-3 mils. A solder mask 440 is positioned outside of the ring 400. The solder mask or solder resist has a height of less than 2 mils so that the height of the solder mask or solder resist 440 is less than the height of the ring 400. It should be noted that the solder resist may wick up the outer perimeter of the ring 400 to cover the outer peripheral or outer periphery of the ring 400. A protective coating 460 is placed on top of the pad 410 and also on at least a portion of the ring 400. The protective coating prevents the oxidation of the conductive metal which forms the land 410 and the ring 400.

In one particular embodiment, the land 410 and the ring 400 are formed of copper, which readily oxidizes. By placing a protective coating 460 on the conductive surface 410, any oxide layer formed on the top surface of the protective coating 460 can be easily broken off by flux to make a good electrical contact between a solder ball and the ring 400 and pad 410. The protective coating 460 includes HASL (eutectic Sn—Pb), ENIG (electroless nickel immersion gold), ImAg (immersion silver), ImSn (immersion tin or immersion Sn), or OSP (organic solder protective). The ring 400 about the solder pad 410 is free of any pointed portion that would result in a stress point or stress area. Many times pointed portions are found in a solder mask defined pad. Therefore, the ring 400 and portion of the pad surrounding the solder pad 410 do not produce a localized stress point which will cause the solder ball to crack or fatigue during thermal cycling of the solder ball over the life of the electrical connection.

Furthermore, the ring 400 prevents or lessens pad cratering which occurs mainly due to stress applied during the assembly of a ball grid array with another set of pads. The ring disperses localized forces to prevent the pad cratering that occurs during the assembly process. In addition, the ring 400 about the BGA pad 410 acts as a seat, which tends to guide or direct a solder ball into the proper alignment with the ring 400 and pad 410. As a result, there is less problem with solder ball misalignment after placement on the substrate prior to solder reflow.

Figure 5:
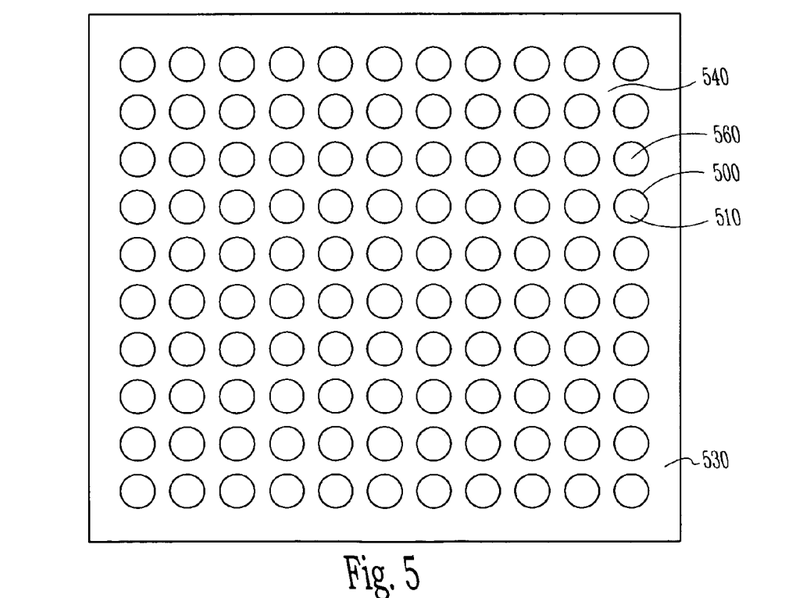
FIG. 5 is a top view of a substrate showing a plurality of rings and lands in an array, according to an embodiment of this invention.

FIG. 5 is a top view of a substrate 530 showing a plurality of rings 500 and lands 510. The rings 500 and lands 510 are all placed in an array. As shown in FIG. 5, the array includes 10 rows and 11 columns of rings 500 and lands 510. The portion of the substrate outside the rings 500 is covered by a solder mask or by a solder resist material, as depicted by reference numeral 540. The land and a portion of the ring is covered by a protective material 560. As shown in FIG. 5, the substrate could be associated with either a printed circuit board, a component, a die, or a package associated with a component. Thus, it is contemplated that the ringed pads could be used at various levels in the packaging. Furthermore, the ringed lands can be used at any level of packaging or at any level of connecting one component or semiconductor device to another component or semiconductor device.

Figure 6:
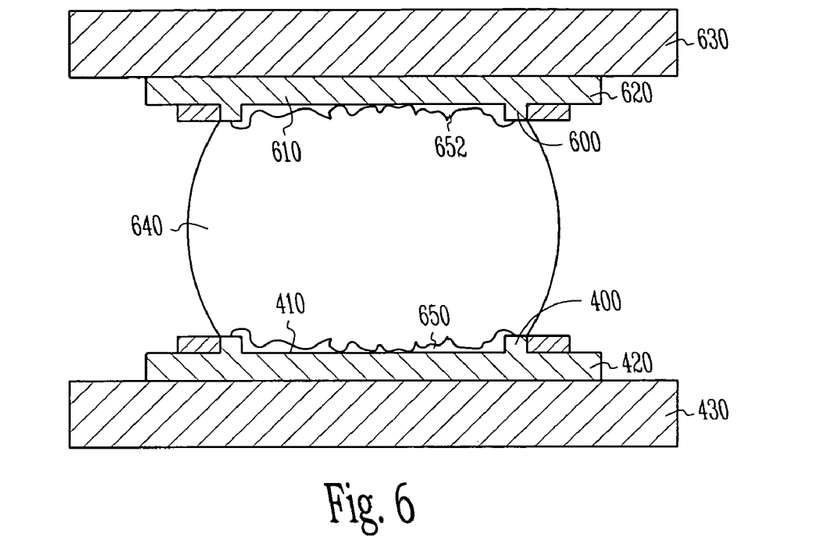
FIG. 6 illustrates a schematic side view of a ring for a BGA land on a component and a ring for a BGA land on a substrate attached to one another, according to an embodiment of this invention.

FIG. 6 is a schematic side view of a ring 400 for a BGA land 410 on a first component or substrate 430 and a ring 600 for a BGA land 610 on a substrate 630 associated with a second semiconductor device or component. In FIG. 6, a solder ball 640 is attached to the pad 410 and ring 400 as well as to the pad 610 and ring 600 of the respective components having substrates 430 or 630. As shown, the solder ball 640 was placed on one of the first or second ring and pad assemblies. Therefore, the solder was deposited on either the ring 400 and pad 410, or onto the ring 600 and the pad 610. Once attached to one or the other of the devices, the component carrying the solder ball 640 is aligned or seated into the ring and pad of the other device. The solder associated with the solder ball 640 is then reheated so that it reflows. The end result is the solder ball 640 being attached to both the ring 600 and pad 610 as well as the ring 400 and the pad 410. As can be seen, an intermetallic compound 650 is formed between the pad 410 and ring 400 and the solder ball 640. Similarly, an intermetallic compound 652 is formed between the pad 610 and ring 600 and the solder ball 640. The intermetallic compound is formed from the surface coating, as well as the solder associated with the solder ball 640, and is formed when the solder associated with the solder ball 640 is heated and reflowed. It should be noted that the height of the intermetallic compound 650, 652 is generally below the height of the adjacent ring. The height of the intermetallic compound is exaggerated for the purpose of illustration.

Figure 7:
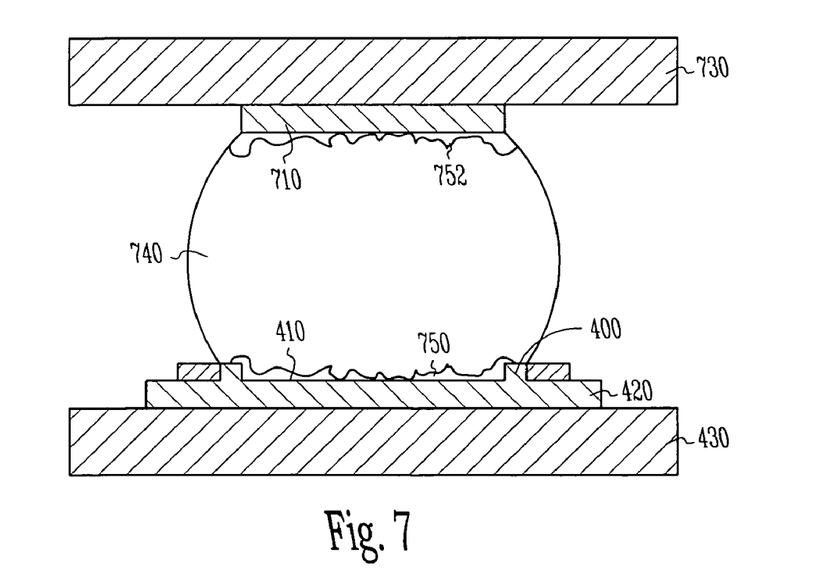
FIG. 7 illustrates a schematic side view of a ring for a BGA land on a substrate and a metal defined flat pad and solder ball attached thereto, according to an embodiment of this invention.

FIG. 7 illustrates a schematic side view of a ring 400 for a BGA land 410 on a substrate 430 attached to a metal-defined flat pad 710 and solder ball 740 attached thereto, according to an embodiment of this invention. In other words, FIG. 7 shows that the substrate 730 of a component need not always have a ring circumscribing the pad. In other words, a component that has either a metal-defined flat pad 710 as shown in FIG. 7, or a solder masked defined flat pad can be attached or can be joined with a ringed land arrangement such as shown in FIG. 7. It should be noted that intermetallic compounds 750 and 752 are formed near the junction to where the solder ball is attached to the respective pad. Again, the height of the intermetallic compound is exaggerated for the purpose of illustration.

Figure 8A:
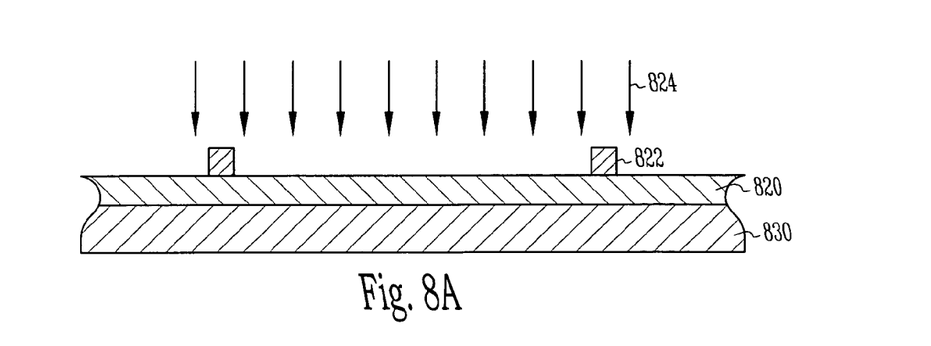
FIG. 8A is a cross-sectional schematic showing a step in a process for forming one or more ringed BGA lands on a substrate, according to an embodiment of this invention.
Figure 8B:
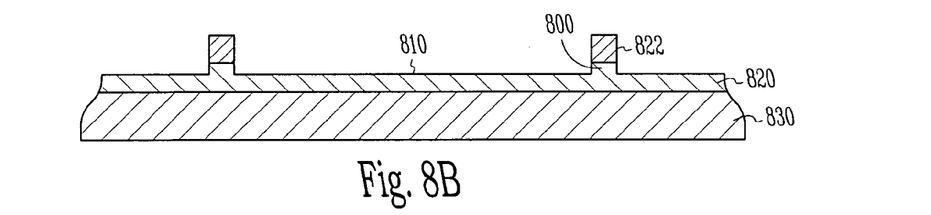
FIG. 8B is a cross-sectional schematic showing a step in a process for forming one or more ringed BGA lands on a substrate, according to an embodiment of this invention.
Figure 8C:
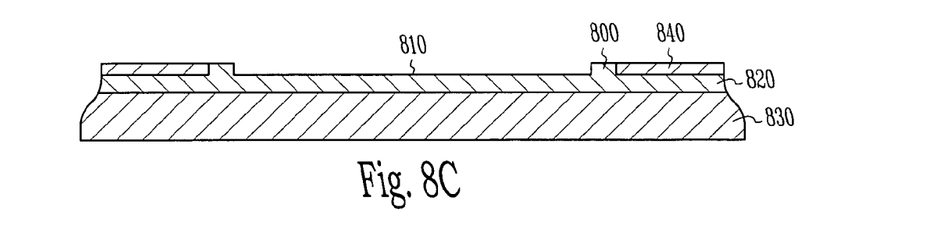
FIG. 8C is a cross-sectional schematic showing a step in a process for forming one or more ringed BGA lands on a substrate, according to an embodiment of this invention.
Figure 8D:
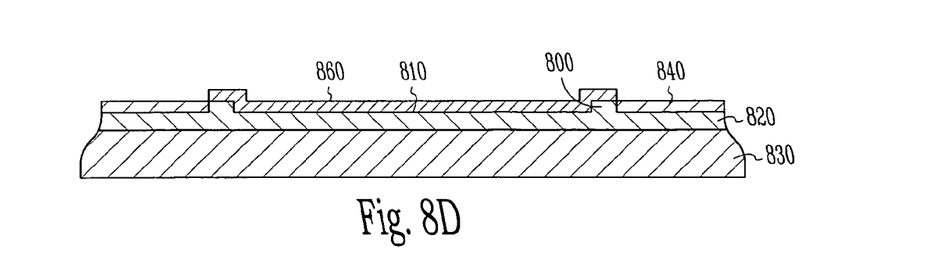
FIG. 8D is a cross-sectional schematic showing a step in a process for forming one or more ringed BGA lands on a substrate, according to an embodiment of this invention.

FIGS. 8A, 8B, 8C and 8D are cross-sectional schematic views showing various steps in a process for forming one or more ringed BGA lands on a substrate, according to an embodiment of this invention. Turning now to FIG. 8A, a copper layer 820 is deposited upon a substrate 830. A mask in the shape of a ring is formed on top of the copper layer using photolithography and a photoresist or similar method. A portion of the copper layer 820 is then etched or subjected to an etch as depicted by the arrows 824 shown in FIG. 8A. FIG. 8B shows the method after the etching step. In this particular cross-sectional view, portions of the metal layer or copper layer 820 had been removed. The photoresist 822 is positioned on top of the ring 800 that has been formed by the etching process. The photoresist is removed, thereby leaving a ring 800. The ring 800 surrounds a pad 810 which has also been formed via the etching process. The photoresist is removed, as shown in FIG. 8C. A solder resist 840 is placed around the outer periphery of the ring 800. The solder resist 840 can be deposited over the entire surface and then removed from the ring 800 and pad 810. The next step is to add a protective layer 860 over the pad 810 and the ring 800.

Of course, the ring 800 may be formed in any number of ways, including depositing copper through a mask onto the substrate or onto a copper layer 820. There are numbers of ways to form the ring surrounding a pad which are contemplated by this invention.

The coating layer on the inside of the ring is the same as normal surface finish, such as HASL (eutectic Sn—Pb), ENIG (Electroless Nickel Immersion Gold), ImAg (Immersion Silver), ImSn (Immersion Sn) or OSP (Organic Solder Protective). With the metallic coating on the copper ring surface, IMC (intermetallic compound) will be formed between metallic surface coating with Copper.

A ball grid array device includes a substrate, further including a first major surface and a second major surface. An array of pads is positioned on one of the first major surface or the second major surface. At least some of the pads include a raised ring. The raised ring circumscribes the pad or surrounds an interior pad or land on the substrate. The interior pad is made of the same material as the raised ring. In some embodiments, a solder mask covers at least a portion of first major surface or the second major surface outside the raised ring. A protective compound covers at least a portion of the raised ring. The protective compound covers at least a portion of the raised ring and the portion of the pad inside the raised ring. In some embodiments, the protective compound has a thickness in the range of 0.1 mils to 0.4 mils. In some embodiments, the raised ring has a height in the range of 0.5 to 2.0 mils. The raised ring is dimensioned so as to form a seat for a solder ball.

An assembly includes a first ball grid array device, which further includes a first major surface and a second major surface. The first ball grid array device includes an array of pads positioned on one of the first major surface or the second major surface. At least some of the pads include a raised ring. A second ball grid array device includes solder balls seated into at least some of the pads including a raised ring. In one embodiment, the solder balls of the second ball grid array device are placed on metal defined pads. In another embodiment, the solder balls of the second ball grid array device are placed on solder mask defined pads. In still another embodiment, the solder balls of the second ball grid array device are placed on pads including a raised ring. The first ball grid array device further includes a solder mask covering at least a portion of the first major surface or the second major surface outside the raised ring. The first ball grid array device further includes an intermetallic compound covering at least a portion of the raised ring and the pad. In some embodiments, the raised ring has a height in the range of 0.5 to 2.0 mils.

Figure 9:
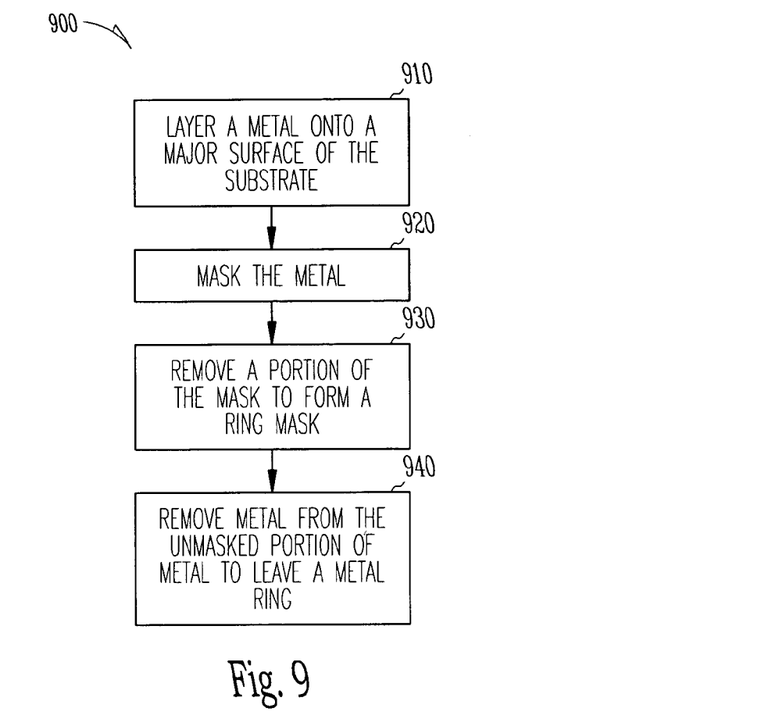
FIG. 9 is a flow diagram showing a method for forming a ringed land on a substrate, according to an embodiment of this invention.

FIG. 9 is a flow diagram showing a method for forming a ringed land on a substrate 900. The method for forming a ringed land on a substrate 900 includes layering metal onto a major surface of the substrate 910, masking the metal 920, removing a portion of the mask to form a ring mask 930, and removing metal from the unmasked portion of copper to leave a metal ring 940. The method further includes forming a land on the substrate, the ring formed over the land. The method further includes placing a solder mask over a portion of the substrate beyond the outer perimeter of the ring. The method also includes placing a protective coating onto the land.

Figure 10:
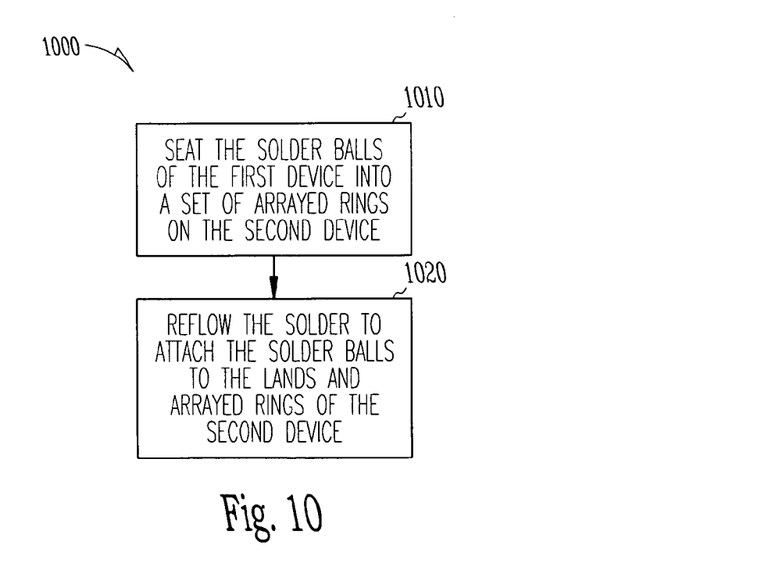
FIG. 10 is a flow diagram showing a method of attaching a first device having an array of solder balls to a second device having an array of ringed lands, according to an embodiment of this invention.

FIG. 10 is a flow diagram showing a method of attaching a first device having an array of solder balls to a second device having an array of ringed lands 1000. The method for attaching a first device having an array of solder balls to a second device having an array of ringed lands 1000 includes seating the solder balls of the first device into a set of arrayed rings on the second device 1010, and reflowing the solder to attach the solder balls to the lands and arrayed rings of the second device 1020.

The method and structures shown and described in the above figures and the written description provides many advantages. Using the inventive method and structure results in the balls of a ball grid array type device being substantially co-planar. In other words, the difference in ball height at the free end of the balls will be within a standard specification for co-planarity. The method accommodates warpage that results from the attachment of the die to the ball grid array package. The solution is inexpensive and easily implemented. The result is a ball grid array device that presents a co-planar surface and has good connectivity to other components in different applications.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A ball grid array device comprising:
  a substrate, further including:
    a first major surface; and
    a second major surface; and
  an array of pads positioned on one of the first major surface or the second major surface, at least some of the pads including a raised ring, wherein the raised ring has a height in the range of 0.5 to 2.0 mils.

2. The ball grid array device of claim 1 wherein the raised ring is dimensioned to form a seat for a solder ball.

3. An assembly comprising:
  a first ball grid array device, further including:
    a first major surface;
    a second major surface; and
    an array of substantially flat pads positioned on one of the first major surface or the second major surface, at least some of the pads including a raised ring; the raised ring including:
      a raised surface in a plane substantially parallel to the flat pad;
      an inner portion that includes a portion substantially coplanar with the flat pad; and
      an outer portion that includes a portion substantially coplanar with a the flat pad; and
    a solder ball attached to at least one of the pads and included raised ring; and
  a second ball grid array device including at least one pad, the solder ball attached to the at least one pad of the second ball grid array device, at least one of the first ball grid array device or the second ball grid array device having a protective layer covering at least one of the pads and included raised ring.

4. The assembly of claim 3 wherein the solder ball is attached to a metal defined pad on the second ball grid array device.

5. The assembly of claim 3 wherein the solder ball is attached to a solder mask defined pad on the second ball grid array device.

6. The assembly of claim 3 wherein the solder ball is placed on a pad including a raised ring.

7. An assembly comprising:
  a first ball grid array device, further including:
    a first major surface;
    a second major surface; and
    an array of pads positioned on one of the first major surface or the second major surface, at least some of the pads including a raised ring; and
  a second ball grid array device including solder balls seated in at least some of the pads including a raised ring, wherein the raised ring has a height in the range of 0.5 to 2.0 mils.

8. A method for attaching a first device having an array of solder balls to a second device having an array of ringed lands comprising:
  seating the solder balls of the first device into a set of arrayed rings on the second device; and
  reflowing the solder to attach the solder balls to the lands and arrayed rings of the second device, at least one of the arrayed rings having:
    a raised surface portion in a plane substantially parallel to the land; and
    an inner portion having at least a portion coplanar to the land and
    an outer portion having at least a portion coplanar with the land surrounded by the ring.

* * * * *

UNITED STATES PATENT AND TRADEMARK OFFICE
CERTIFICATE OF CORRECTION

PATENT NO. : 7,230,339 B2
APPLICATION NO. : 10/402101
DATED : June 12, 2007
INVENTOR(S) : Key et al.

It is certified that error appears in the above-identified patent and that said Letters Patent is hereby corrected as shown below:

In column 7, line 34, in Claim 3, after "coplanar with" delete "a".

Signed and Sealed this

Eighth Day of July, 2008

JON W. DUDAS
*Director of the United States Patent and Trademark Office*